United States Patent [19]

Eylon et al.

[11] Patent Number: 5,879,760
[45] Date of Patent: Mar. 9, 1999

[54] TITANIUM ALUMINIDE ARTICLES HAVING IMPROVED HIGH TEMPERATURE RESISTANCE

[75] Inventors: Daniel Eylon, Dayton; Paul R. Smith, Miamisburg, both of Ohio

[73] Assignee: The United States of America as represented by the Secretary of the Air Force, Washington, D.C.

[21] Appl. No.: 972,050

[22] Filed: Nov. 5, 1992

[51] Int. Cl.$^6$ .............. C23C 8/36; C23C 14/14; C23C 14/18; C22F 1/18
[52] U.S. Cl. .......... 427/528; 427/531; 427/405; 148/669; 148/239
[58] Field of Search ............ 427/523, 527, 427/528, 530, 531, 455, 456, 566, 576, 584, 250, 252, 253, 255.2, 405; 148/239, 669, 670

[56] References Cited

U.S. PATENT DOCUMENTS

| | | | |
|---|---|---|---|
| 4,137,370 | 1/1979 | Fujishiro et al. | 428/660 |
| 4,181,590 | 1/1980 | Fujishiro et al. | 427/528 |
| 4,292,077 | 9/1981 | Blackburn et al. | 75/175.5 |
| 4,433,005 | 2/1984 | Manty et al. | 427/528 |
| 4,465,524 | 8/1984 | Dearnaley et al. | 148/239 |
| 4,746,374 | 5/1988 | Froes et al. | 148/11.5 F |
| 4,838,337 | 6/1989 | Seimers | 164/46 |
| 4,847,044 | 7/1989 | Ghosh | 419/8 |
| 4,893,743 | 1/1990 | Eylon et al. | 228/181 |
| 4,896,815 | 1/1990 | Rosenthal et al. | 228/120 |
| 4,917,858 | 4/1990 | Eylon et al. | 419/28 |
| 4,957,421 | 9/1990 | Baldi | 419/63 |
| 4,980,127 | 12/1990 | Parris et al. | 420/418 |
| 5,006,419 | 4/1991 | Grunke et al. | 428/660 |
| 5,045,407 | 9/1991 | Ritter | 427/455 |
| 5,049,418 | 9/1991 | Tobin | 427/405 |
| 5,139,824 | 8/1992 | Liburdi et al. | 427/255.2 |

FOREIGN PATENT DOCUMENTS 3111557  5/1991  Japan ................ 427/528

OTHER PUBLICATIONS

Fujishiro et al. "Creep property improvement of $\alpha+\beta$ Ti-alloys by Pt$^{30}$ plating", *Thin Solid Films*, 63 (1979) p. 55–60 (no month) 427/531.

Fujishiro et al. "Improved high temp. mech. properties of Ti-alloys by Pt$^{30}$ plating", *Thin Solid Films*, 54, (1978) p. 309–315 (no month) 427/528.

*Primary Examiner*—Marianne Padgett
*Attorney, Agent, or Firm*—Charles E. Bricker; Thomas L. Kundert

[57] ABSTRACT

A method for protecting a titanium aluminide substrate against environmental degradation at higher temperatures, which comprises applying a layer of a ductile titanium alloy to at least one exterior surface of the substrate and applying an oxidation resistant coating to the exterior surface of the ductile layer. The titanium aluminide substrate may be monolithic or a fiber-reinforced composite structure. The oxidation resistant coating is an ion-plated coating of (a) a noble metal, such as gold or platinum, or (b) a coating of tungsten followed by an ion-plated coating of a noble metal.

4 Claims, 1 Drawing Sheet

TITANIUM ALUMINIDE ARTICLES HAVING IMPROVED HIGH TEMPERATURE RESISTANCE

RIGHTS OF THE GOVERNMENT

The invention described herein may be manufactured and used by or for the Government of the United States for all governmental purposes without the payment of any royalty.

BACKGROUND OF THE INVENTION

This invention relates to a method for treating titanium aluminide structures so as to provide improved high temperature properties.

Considerable research work has been directed toward the development of materials suitable for use in fabricating jet engine parts and other aircraft and aerospace components. A suitable material must be light weight and resistant to oxidation while having high creep, fatigue and tensile strength. Examples of such components include compressor blades, engine casings, heat panels and exhaust gas ducts.

A leading candidate material for these applications is titanium, particularly titanium alloys. However, the use of titanium alloy components is limited by the alloy's high reactivity to oxygen and the formation of an unstable oxide layer, at temperatures above about 1000° F. (538° C.), resulting in a degradation of mechanical properties.

Titanium aluminides, both as monolithic materials and as matrices for fiber-reinforced composites, have received considerable attention due to their potential superior high temperature properties together with their relatively low density. However, one obstacle to full use in both advanced gas turbine engine applications and advanced hypersonic structures is their low resistance to environmental degradation at higher temperatures. For example, it has been shown for alpha-2 titanium aluminides that exposure in an air environment to temperatures exceeding 1200° F. (650° C.) can result in significant embrittlement of the material surface which, in turn, leads to surface cracking under an applied load (in the case of a monolithic material) or after thermal cycling (in the case of a composite material). This surface embrittlement is the result of (1) the formation of a tenacious brittle oxide layer and (2) solid state diffusion of oxygen into the aluminide substrate, adversely affecting its ductility. Titanium aluminide alloys typically contain niobium as a beta stabilizing element and for enhanced oxidation resistance. It has been shown that local depletion of niobium from the exposed surface, forming a niobium oxide, results in the formation of a very brittle alpha or alpha-2 layer immediately below the oxide. When such material is loaded, particularly under cyclic, mechanical and thermal conditions, the brittle oxide cracks, providing a notch effect on the matrix as well as a preferred path for continued oxygen penetration and local embrittlement. Inasmuch as titanium aluminides are extremely notch sensitive, the result is a pronounced degradation in mechanical properties, both monotonic as well as cyclic. Brittle coatings, such as those which form a titanium aluminide coating based on $TiAl_3$, have proven to be ineffective in protecting these materials because the coating cracks early in loading and provides preferred sites for environmental attack.

Fujishiro et al, U.S. Pat. No. 4,181,590, disclose that components fabricated from titanium alloys can be rendered resistant to oxidation by implanting ions of a noble metal or noble metal alloy into the substrate and thereafter continuing impingement of the metal ions onto the substrate to form a film or coating thereon. This method is quite effective for the alpha, alpha-beta and beta titanium alloys. However, the titanium aluminide alloys are generally more prone to surface cracking under an applied load or after thermal cycling, thus leading to cracking of any oxidation resistant coating. What is desired is a structure which provides oxidation resistance to the titanium aluminide component and which is resistant to cracking under an applied load or thermal cycling.

Thus it is an object of the present invention to provide a method for protecting a titanium aluminide substrate against environmental degradation.

Other objects and advantages of the invention will be apparent to those skilled in the art.

SUMMARY OF THE INVENTION

In accordance with the present invention there is provided a method for protecting a titanium aluminide substrate against environmental degradation at higher temperatures, which comprises applying a layer of a ductile titanium alloy to at least one exterior surface of the substrate and applying an oxidation resistant coating to the exterior surface of the ductile layer.

The titanium-aluminum alloys suitable to be protected according to the present invention are those alloys containing about 10 to 50 atomic percent aluminum and about 80 to 50 atomic percent titanium. These alloys are known collectively as titanium aluminides. In addition, the Ti—Al alloy may contain varying amounts of other elements, such as, for example, Nb, Mo, V and W. Examples of titanium aluminide alloys include (by weight percent) Ti—36Al, Ti—13Al—31Nb, Ti—11A—39Nb, Ti—31Al—2.5Cr—2.5Nb, Ti—15.8Al, Ti—14Al—22Nb, Ti—14.3Al—19.7Nb, Ti—15Al—10.3Nb, Ti—15.4Al—5.3Nb, Ti—31.5Al and Ti—14.6Al—10Nb—4W.

The titanium aluminide substrate may be monolithic or a fiber-reinforced composite structure. The latter comprise a plurality of bonded plies of metal matrix material and high strength/high stiffness filaments or fibers. At least four high strength/high stiffness filaments or fibers are commercially available: silicon carbide, silicon carbide-coated boron, boron carbide-coated boron and silicon-coated silicon carbide. Such composites are fabricated by consolidating a preform consisting of a alternating plies or layers of metal matrix material and filamentary material. Alternatively, the preform layers can be prepared by tape casting, plasma spray deposition, physical vapor deposition or the like. Consolidation of the filament/metal matrix preform is accomplished by the application of heat and pressure over a period of time during which the metal matrix material is superplastically formed around the filaments to completely embed them. Consolidation is carried out at a temperature in the approximate range of 0° to 250° C. (0° to 450° F.) below the beta-transus temperature of the alloy. The beta-transus temperature is the minimum temperature at which the allotropic transformtion to the high temperature body-centered cubic phase is complete. For example, the consolidation of a composite comprising Ti—14Al—22Nb alloy, which has a beta-transus of about 1120° C. (2050° F.), is preferably carried out at about 980° C. (1800° F.). The pressure required for consolidation of the composite ranges from about 35 to about 300 MPa (about 5 to 40 Ksi) and the time for consolidation ranges from about 15 minutes to 24 hours or more, depending on the dimensions of the preform.

Monolithic titanium aluminide substrates may be fabricated using any technique known in the art, such as by casting, hot forging, powder metallurgy techniques, or the like.

Figure 1:
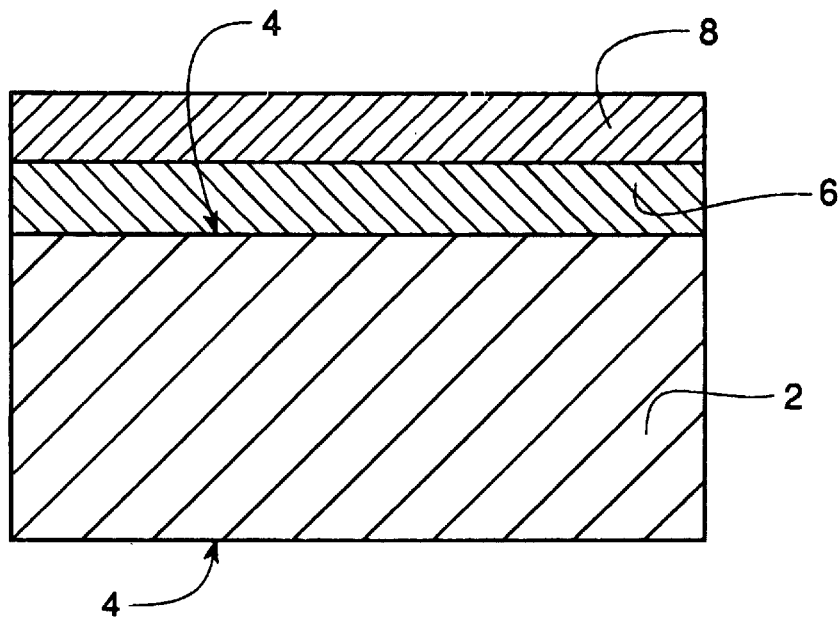
FIG. 1 illustrates, in cross section, a monolithic titanium aluminide substrate having environmental degradation resistant layers bonded to one exterior surface.
Figure 2:
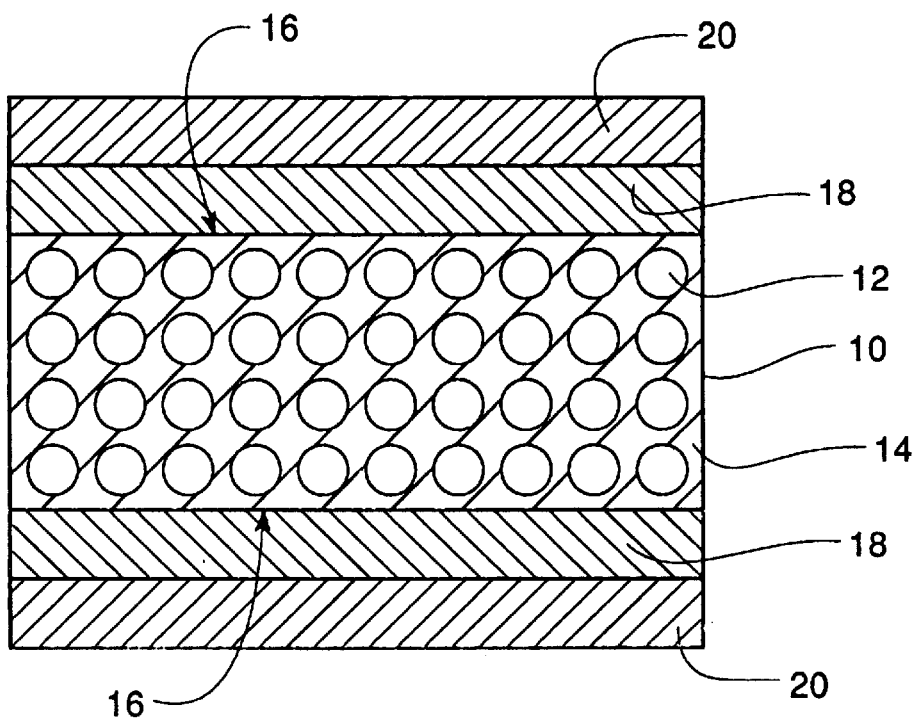
FIG. 2 illustrates, in cross section, a fiber reinforced titanium aluminide composite having environmental degradation resistant layers bonded to both exterior surfaces.

Referring to the drawing, FIG. 1 illustrates a monolithic titanium aluminide substrate 2 having exterior surfaces 4. One surface 4 is protected against environmental degradation by a layer of ductile titanium alloy 6 and an oxidation resistant coating 8. FIG. 2 illustrates a metal matrix composite substrate 10 comprising a plurality of reinforcing fibers 12 embedded in a titanium aluminide matrix 14, and having exterior surfaces 16. Surfaces 16 are each protected against environmental degradation by a layer of ductile titanium alloy 18 and an oxidation resistant coating 20.

The titanium aluminide substrate, whether it be monolithic or composite, is protected against environmental degradation by first bonding a layer of a ductile titanium alloy to at least one exterior surface of the substrate and then applying an oxidation resistant coating to the exterior surface of the ductile layer.

The ductile titanium alloys suitable for use in the present invention are the alpha-beta titanium alloys and the metastable beta titanium alloys. Examples of suitable alloys include Ti—6Al—4V, Ti—6Al—2Sn—4Zr—6Mo, Ti—5Al—6Sn—1Mo—0.25Si, Ti—15Mo—2.7Nb—3Al—0.2Si (Beta 21S), Ti—13V—11Cr—3Al, Ti—11.5Mo—6Zr—4.5Sn (Beta III), Ti—3Al—8V—6Cr—4Mo—4Zr, Ti—10V—2Fe—3Al and Ti—15V—3Al—3Sn—3Cr. Beta alloys containing a significant amount of niobium, i.e., greater than about 7 wt %, are particularly useful when employed with a high niobium content titanium aluminide composite substrate, for example, Ti—24Al—11Nb. An example of such a beta alloy is Ti—15Nb—3Mo—5Al.

The ductile titanium alloy can be applied to the substrate by mechanical means, such as by superplastic forming/diffusion bonding under very high temperature and pressure, a thin layer of the alloy to at least one exterior surface of the substrate. The term thin is intended to mean about 25 to 100 μm. Alternatively, the ductile titanium alloy can be deposited on the substrate surface by an atomization technique, such as plasma spray deposition. In the fabrication of metal matrix composite structures, it may be advantageous to include the ductile titanium alloy layer or layers in the composite preform prior to consolidation.

The oxidation resistant coating is an ion-plated coating of (a) a noble metal, such as gold or platinum, or (b) a coating of tungsten followed by an ion-plated coating of a noble metal.

Procedures and apparatus described in the literature for conducting ion plating can be used in the practice of this invention. Briefly, ion plating is a two-stage process. First, there is an impregnation stage in which the ionized metal atoms are implanted into the substrate. Second, the ions are plated out onto the ion-implanted substrate, forming a protective coating. The two stages of this process can be termed ion implantation and ion plating, respectively. It is the combination of ion implantation and ion plating which makes possible the cohesive coating which is resistant to oxidation and which is not subject to separation or spalling upon exposure to high temperatures for extended periods of time. The initial ion implantation is an essential step prior to ion plating since the ion implanted substrate provides a sound and stable base that is conducive to film formation by ion plating. The two stages, i.e., ion implantation and ion plating, generally take about 2 to 5 minutes, providing a coating having a thickness of about 0.5 to 1.5 microns.

As used herein, the term noble metal includes ruthenium (Ru), rhodium (Rh), palladium (Pd), osmium (Us), iridium (Ir), gold (Au) and platinum (Pt). It is also within the scope of this invention to use alloys of these metals. An example alloy is 80% Pt/20% Rh.

In articles protected against environmental degradation according to the present invention, if the outer coating cracks during high temperature service, the ductile underlying titanium alloy layer will prevent the crack from reaching the very notch-sensitive titanium aluminide component. The ductile layer will also act as an additional diffusion barrier against enhanced oxidation into the cracked region.

Various modifications may be made to the invention as described without departing from the spirit of the invention or the scope of the appended claims.

We claim:

1. A method for protecting a titanium aluminide substrate against environmental degradation which comprises (1) applying a layer of ductile titanium alloy to at least one exterior surface of said substrate and (2) ion-plating a layer of tungsten followed by a layer of a noble metal onto the exterior surface of said ductile layer.

2. The method of claim 1 wherein said ductile alloy is a beta titanium alloy.

3. The method of claim 2 wherein said ductile alloy is Ti—15Mo—3Al—2.7Nb—0.2Si.

4. The method of claim 2 wherein said ductile alloy is Ti—15Nb—3Mo—5Al.

* * * * *